_(12)_ United States Patent
Kim et al.

(10) Patent No.: US 8,872,692 B2
(45) Date of Patent: Oct. 28, 2014

(54) DISTANCE MEASURING DEVICE AND RECEIVING DEVICES THEREOF

(75) Inventors: Tae Wook Kim, Seoul (KR); Man Keun Kang, Busan (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 67 days.

(21) Appl. No.: 13/823,771

(22) PCT Filed: Sep. 9, 2011

(86) PCT No.: PCT/KR2011/006709
§ 371 (c)(1),
(2), (4) Date: Mar. 15, 2013

(87) PCT Pub. No.: WO2012/036431
PCT Pub. Date: Mar. 22, 2012

(65) Prior Publication Data
US 2013/0176158 A1    Jul. 11, 2013

(30) Foreign Application Priority Data

Sep. 15, 2010  (KR) .................. 10-2010-0090599
Sep. 6, 2011   (KR) .................. 10-2011-0090361

(51) Int. Cl.
| | | |
|---|---|---|
| H03M 1/50 | (2006.01) | |
| G09B 23/28 | (2006.01) | |
| G04F 10/00 | (2006.01) | |
| G01S 13/88 | (2006.01) | |
| G01S 13/10 | (2006.01) | |
| A61H 31/00 | (2006.01) | |

(52) U.S. Cl.
CPC ............ *G04F 10/005* (2013.01); *G09B 23/288* (2013.01); *A61H 2201/5097* (2013.01); *A61H 2201/5064* (2013.01); *G01S 13/88* (2013.01); *G01S 13/10* (2013.01); *A61H 31/005* (2013.01); *H03M 1/50* (2013.01)
USPC .......................................... 341/166

(58) Field of Classification Search
CPC .......... G04F 10/005; H03M 1/60; H03M 1/50
USPC .................................. 341/155, 166
See application file for complete search history.

(56) References Cited

U.S. PATENT DOCUMENTS 6,097,674 A *  8/2000  Swapp .................. 368/113
6,295,019 B1  9/2001  Richards et al.
(Continued)

FOREIGN PATENT DOCUMENTS

| JP | 2002-517001 A | 6/2002 |
|---|---|---|
| JP | 2005-217001 A | 8/2005 |
| KR | 10-0887375 B1 | 3/2009 |
| KR | 10-2009-0090231 A | 8/2009 |

(Continued)

OTHER PUBLICATIONS

International Search Report issued in corresponding application No. PCT/KR2011/006709 mailed Apr. 25, 2012.

*Primary Examiner* — Khai M Nguyen
(74) *Attorney, Agent, or Firm* — Carter, DeLuca, Farrell & Schmidt, LLP

(57) ABSTRACT

Provided are a distance measuring device using an impulse signal and a receiving device thereof. The distance measuring device includes: a transmitting device transmitting an impulse signal; and a receiving device receiving the impulse signal and measuring a time interval (hereinafter, referred to as a delay time) between a transmitting timing and a receiving timing of the impulse signal, wherein the receiving device measures the delay time through a Time to Digital Converter (TDC) technique. According to the present invention, the distance measuring device measures the distance accurately and speedily.

22 Claims, 18 Drawing Sheets

(56) References Cited

U.S. PATENT DOCUMENTS

| | | |
|---|---|---|
| 7,209,071 B1 | 4/2007 | Boring |
| 7,209,469 B2 | 4/2007 | Runkle et al. |
| 7,492,316 B1 * | 2/2009 | Ameti et al. .................. 342/465 |
| 7,872,602 B2 * | 1/2011 | Chen .............................. 341/166 |

FOREIGN PATENT DOCUMENTS

| | | |
|---|---|---|
| KR | 10-2010-0005397 A | 1/2010 |
| KR | 10-2010-0008158 A | 1/2010 |
| KR | 10-2010-0011848 A | 2/2010 |

* cited by examiner

DISTANCE MEASURING DEVICE AND RECEIVING DEVICES THEREOF

TECHNICAL FIELD

The present invention disclosed herein relates to the distance measuring device, and more particularly, to a distance measuring device using an impulse signal and a receiving device thereof.

BACKGROUND ART

Recently, studies for the distance measuring system using an Impulse Radion-Ultra Wide Band (IR-UWB) method are actively in progress. The IR-UWB method is a technique with a frequency band of more than several GHz in a baseband and without wireless carrier waves and is a new wireless technique applied to communications and radars. The IR-IWB method uses a very narrow pulse of several nano seconds or several pico seconds so that it is realized with low power supply and is interlocked with typical communication systems.

However, in relation to the distance measuring system using the IR-UWB method, it is typically difficult to measure the distance accurately. Due to this difficulty, the distance measuring system using a typical IR-UWB method is extensively applied to fields such as home application systems, which may allow error tolerance of several meters or several centimeters.

DISCLOSURE OF INVENTION

Technical Problem

The purpose of the present invention is to provide the distance measuring system measuring the distance accurately and a receiving device thereof.

Solution to Problem

Embodiments of the present invention provide distance measuring device including: a transmitting device transmitting an impulse signal; and a receiving device receiving the impulse signal and measuring a time interval (hereinafter, referred to as a delay time) between a transmitting timing and a receiving timing of the impulse signal, wherein the receiving device measures the delay time through a Time to Digital Converter (TDC) technique.

In some embodiments, the receiving device may measure the delay time by delaying a signal (hereinafter, referred to as a first signal) synchronized at the transmitting timing of the impulse signal and a signal (hereinafter, referred to as a second signal) synchronized at the receiving timing of the impulse signal, with respectively different time intervals.

In other embodiments, the first signal may be delayed by a first time interval and the second signal may be delayed by a second time interval shorter than the first time interval.

In still other embodiments, the first and second time intervals may be longer than the delay time.

In even other embodiments, the transmitting device may include: a transmit clock signal generator generating a transmit clock signal; an impulse generator converting the transmit clock signal into a digital impulse signal; and a signal distortion filter converting the digital impulse signal into the impulse signal.

In yet other embodiments, the impulse generator may include at least one inverter and at least one XOR gate.

In further embodiments, the receiving device may include: a counter measuring a course delay time between a signal (hereinafter, referred to as a first signal) synchronized at the transmitting timing of the impulse signal and a signal (hereinafter, referred to as a second signal) synchronized at the receiving timing of the impulse signal; and a TDC measuring a fine delay time between the first signal and the second signal.

In still further embodiments, the distance measuring system may further include a synchronizer controlling the counter and the TDC in response to the first and second signals.

In even further embodiments, the synchronizer may include at least one latch and at least one flip-flop.

In yet further embodiments, the distance measuring system may further include a calculator measuring the delay time by subtracting the fine delay time from the course delay time.

In other embodiments of the present invention, distance measuring device include: a transmitting device transmitting an impulse signal; and a receiving device receiving the impulse signal and measuring a time interval between as a transmitting timing and a receiving timing of the impulse signal, wherein the receiving device includes: a demodulation unit demodulating the received impulse signal into a receive clock signal; and the distance measuring unit measuring a time interval (hereinafter, referred to as a delay time) between a signal (hereinafter, referred to as a transmit clock signal) synchronized at the transmitting time of the impulse signal and the receive clock signal through a TDC technique.

In some embodiments, the distance measuring unit may measure the delay time by delaying the transmit clock signal and the receive clock signal with respectively different time intervals.

In other embodiments, the distances measuring unit may include: a counter measuring a course delay time between the transmit clock signal and the receive clock signal; and a TDC measuring a fine delay time between the transmit clock signal and the receive clock signal.

In still other embodiments, the distance measuring device may further include a synchronizer controlling the counter and the TDC in response to rising edges of the transmit clock signal and the receive clock signal.

In even other embodiments, the synchronizer may include at least one latch and at least one flip-flop.

In still other embodiments of the present invention, receiving devices of a distance measuring device include: a demodulation unit receiving an impulse signal and demodulating the received impulse signal into a receive clock signal; and a distance measuring unit measuring a time interval (hereinafter, referred to as a delay time) between a transmit clock signal synchronized at a transmitting timing of the impulse signal and the receive clock signal through a TDC technique.

In some embodiments, the distance measuring unit may include: a counter measuring a course delay time between the transmit clock signal and the receive clock signal; and a fine delay time between the transmit clock signal and the receive clock signal.

In other embodiments, the counter may start to measure the course delay time in response to a rising edge of the transmit clock signal and may start to measure the fine delay time in response to a rising edge of the receive clock signal.

In still other embodiments, the delay time may be a result after the fine delay time is subtracted from the course delay time.

In even other embodiments of the present invention, training mannequins for cardiopulmonary resuscitation include: a transmitting device transmitting an impulse signal; and a receiving device receiving the impulse signal and measuring a time interval (hereinafter, referred to as a delay time) between a transmitting timing and a receiving timing of the impulse signal, wherein the receiving device measures the delay time through a TDC technique and measuring a compression depth through the measured delay time.

In some embodiments, the receiving device may be disposed under a top plate representing the chest of a body and the transmitting device may be disposed on a bottom plate representing a body shape.

In other embodiments, the training mannequins may further include a reflective plate reflecting an impulse signal transmitted from the transmitting device, wherein the transmitting device and the receiving device are disposed under a top plate representing the chest of a body and the reflective plate is disposed on a bottom plate representing a body shape.

Advantageous Effects of Invention

According to the present invention, the distance measuring device measures the distance accurately and speedily.

BEST MODE FOR CARRYING OUT THE INVENTION

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Hereinafter, it will be described about an exemplary embodiment of the present invention in conjunction with the accompanying drawings.

Figure 1:
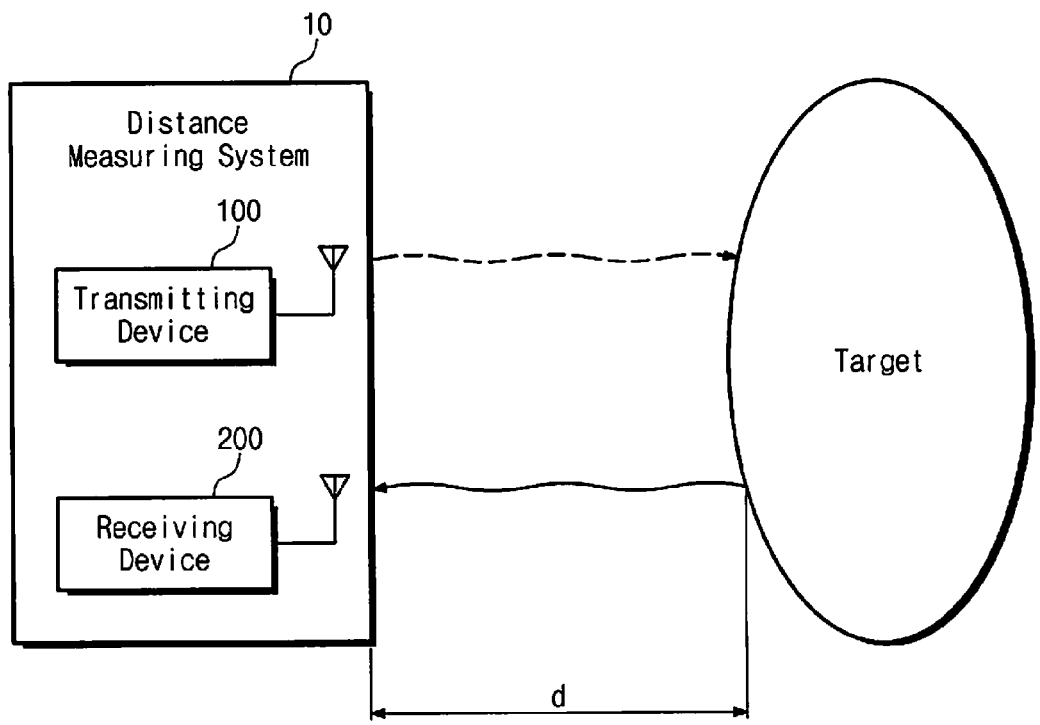
FIG. 1 is the distance measuring system according to a first embodiment.

FIG. 1 is the distance measuring system 10 according to a first embodiment. The distance measuring system 10 using radar is shown in FIG. 1. Referring to FIG. 1, the distance measuring system 10 includes a transmitting device 100 and a receiving device 200. The distance measuring system 10 of FIG. 1 measures the distance between itself 10 and a target.

In more detail, the transmitting device 100 of the distance measuring system 10 transmits a signal to the target and the receiving device 200 thereof receives a reflected signal from the target. The distance measuring system 10 measures a delay time between a transmitted signal from the transmitting device 100 and a received signal by the receiving device 200, in order to measure the distance d between the distance measuring system 10 and the target.

That is, if a position of the target is changed, a time that a transmitted signal returns from the target is changed. Thus, the distance measuring system 10 may measure the distance d between itself 10 and the target. This will be expressed as the following Equation 1.

MathFigure 1

$$d = (c \times \Delta t)/2, c = 3 \times 10^8 \text{ m/s} \qquad \text{[Math.1]}$$

where $\Delta t$ represents a time that a transmitted signal from the transmitting device 100 takes to return to the receiving device 200 and may be called a delay time.

Figure 2:
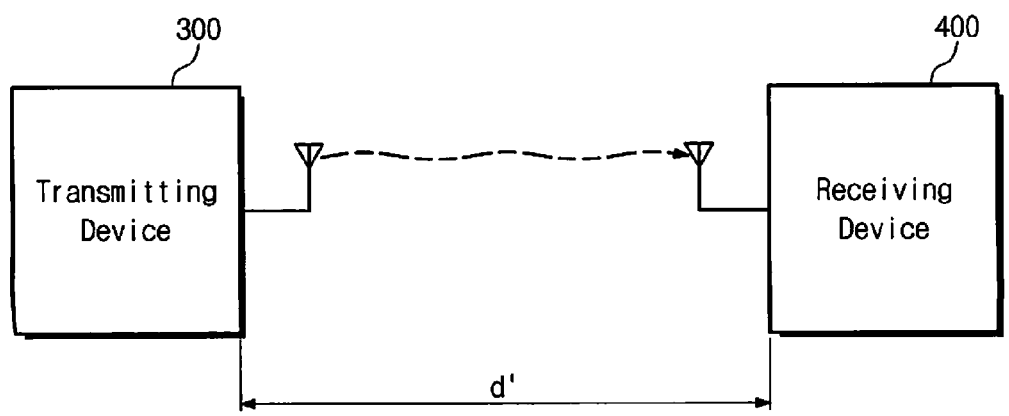
FIG. 2 is a view of the distance measuring system according to a second embodiment.

FIG. 2 is a view of the distance measuring system 20 according to a second embodiment. The distance measuring system 20 using a transceiver is shown in FIG. 2. Since the distance measuring system 20 of FIG. 2 is similar to that 10 of FIG. 1, like reference numerals refer to like elements. The distance measuring system 20 measures the distance between a transmitting device 300 and a receiving device 400.

Similar to the distance measuring system 10 of FIG. 1, the distance measuring system 20 of FIG. 2 measures a delay time between a transmitted signal from the transmitting device 300 and a received signal by the receiving device 400, in order to measure the distance d between the transmitting device 300 and the receiving device 400.

That is, if the distance between the transmitting device 300 and the receiving device 400 is changed, a time that a transmitted signal from the transmitting device 300 is received by the receiving device 400 is changed. Thus, the distance measuring system 20 may measure the distance d between the transmitting device 300 and the receiving device 400. This will be expressed as the following Equation 2.

That is, if a position of the target is changed, a time that a transmitted signal returns from the target is changed. Thus, the distance measuring system 10 may measure the distance d between itself 10 and the target. This will be expressed as the following Equation 1.

MathFigure 2

$$d' = c \times \Delta t, c = 3 \times 10^{\wedge}8 \text{ m/s} \quad [\text{Math.2}]$$

where Δt represents a time that a transmitted signal from the transmitting device 300 takes to be received by the receiving device 400 and may be called a delay time as described with FIG. 1.

Referring to FIGS. 1 and 2, the distance measuring system measures the distance through a delay time. Therefore, in order to measure the distance accurately, it is required to measure a delay time between a transmitted signal and a received signal. Moreover, since a signal transmitted from a transmitting device may be affected by multipath fading, this needs to be minimized.

Accordingly, hereinafter, a transmitting device and a receiving device according to an embodiment of the present invention, which accurately measure a delay time between a transmitted signal and a receive signal and minimizes multipath fading simultaneously, will be described in more detail. For convenience of description, hereinafter, configurations and operations of the transmitting device 100 and the receiving device 200 in the distance measuring system 10 of FIG. 1 will be described. However, it is apparent that the configurations and operations may be applied to the distance measuring system 20 of FIG. 2.

Figure 3:
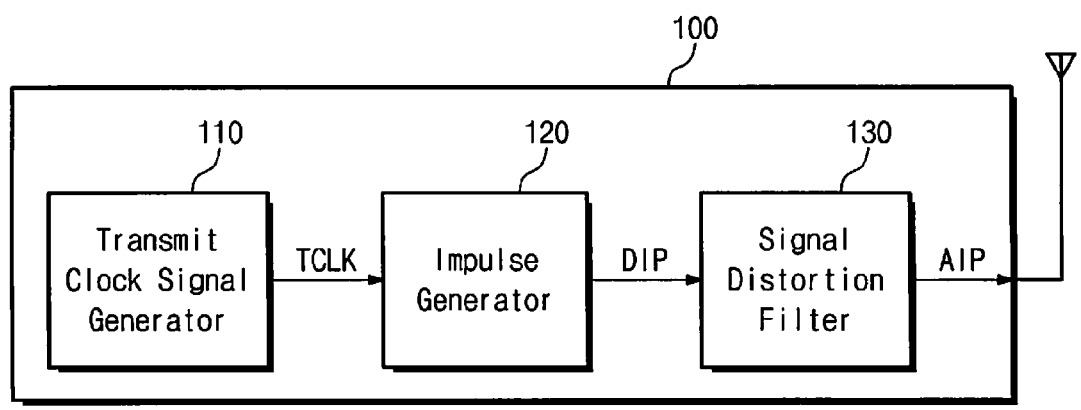
FIG. 3 is a block diagram illustrating a configuration of the transmitting device of FIG. 1.

FIG. 3 is a block diagram illustrating a configuration of the transmitting device 100 of FIG. 1. Referring to FIG. 3, the transmitting device 100 includes a transmit clock signal generator 110, an impulse generator 120, and a signal distortion filter 130.

The transmit clock signal generator 110 generates a transmit clock signal TCLK and transmits the generated transmit clock signal TCLK to the impulse generator 120. Here, the transmit clock signal TCLK may be a clock signal having a predetermined frequency.

The impulse generator 120 receives the transmit clock signal TCLK from the transmit clock signal generator 110. The impulse generator 120 converts the transmit clock signal TCLK into a digital impulse signal DIP and transmits the digital impulse signal DIP to the signal distortion filter 130.

The signal distortion filter 130 receives the digital impulse signal DIP from the impulse generator 120. The signal distortion filter 130 converts the digital impulse signal DIP into an analog impulse signal AIP and transmits the analog impulse signal AIP through an antenna. In this case, the signal distortion filter 130 may further include a power amplifier (not shown) to increase the power of the analog impulse signal AIP.

Figure 4:
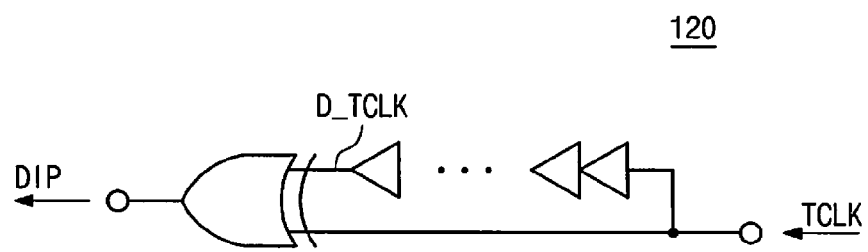
FIG. 4 is a view illustrating a structure of the impulse generator of FIG. 3.

FIG. 4 is a view illustrating a structure of the impulse generator 120 of FIG. 3. For example, as shown in FIG. 4, the impulse generator 120 may be realized with an inverter and an XOR gate. However, this is just exemplary and thus the technical ideas of the present invention are not limited thereto. For example, the impulse generator 120 may be realized with an inverter and an XOR gate and/or a NAND gate.

Figure 5:
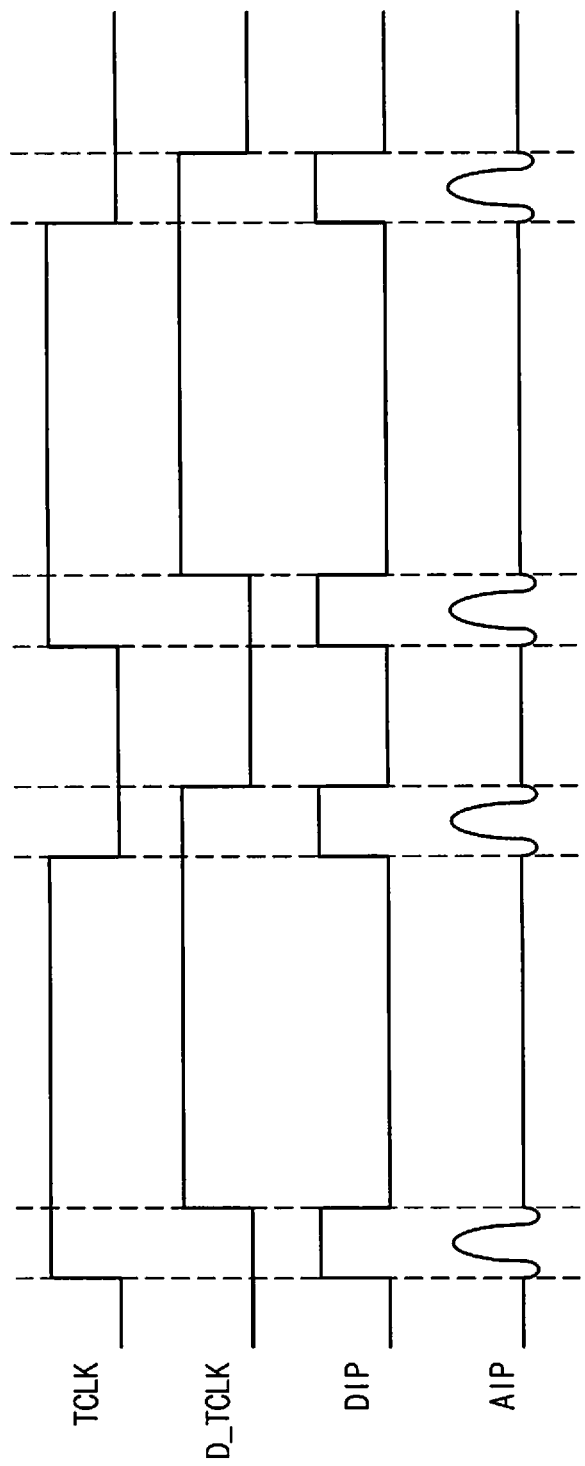
FIG. 5 is a timing diagram illustrating operations of the transmitting device of FIG. 3 and the impulse generator of FIG. 4.

FIG. 5 is a timing diagram illustrating operations of the transmitting device 100 of FIG. 3 and the impulse generator 120 of FIG. 4.

Referring to FIGS. 3 to 5, the inverters of the impulse generator 120 receive a transmit clock signal TCLK generated by the transmit clock signal generator 110. The inverters of the impulse generator 120 delay the transmit clock signal TCLK to generate a delay transmit clock signal D_TCLK. An XOR gate of the impulse generator 120 receives the delay transmit clock signal D_TCLK and transmits a clock signal TCLK and, by using these signals, generates a digital impulse signal DIP. The signal distortion filter 130 receives the digital impulse signal DIP and converts the digital impulse signal DIP into an analog impulse signal AIP.

As described with reference to FIGS. 3 to 5, a transmitting device generates an analog impulse signal to measure a distance. For example, the analog impulse signal may be an impulse signal used in wireless communication techniques of a UWB or IR-UWB method. Since an impulse signal is used, the distance measuring system according to an embodiment of the present invention may have an excellent signal transmittance for buildings and walls and a low-powered communication function.

Figure 6:
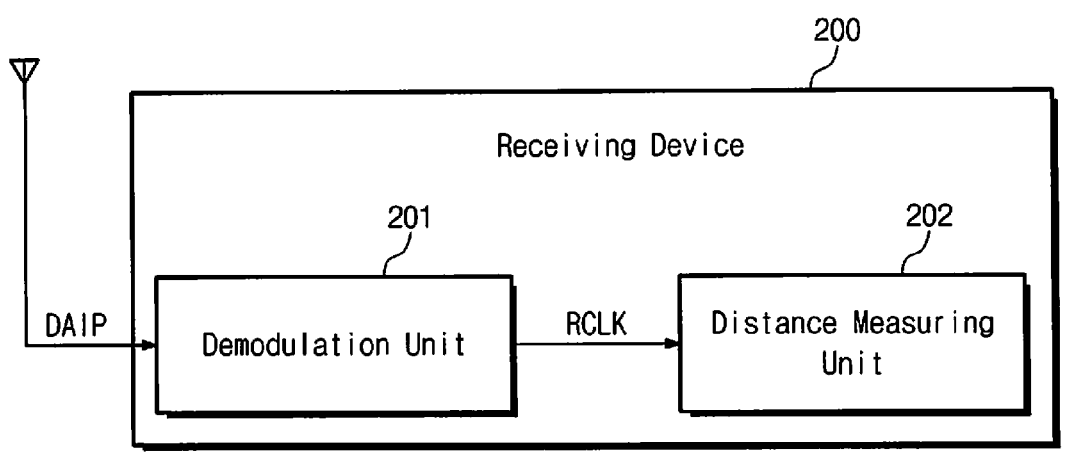
FIG. 6 is a block diagram illustrating a configuration of the receiving device of FIG. 1.

FIG. 6 is a block diagram illustrating a configuration of the receiving device 200 of FIG. 1. Referring to FIG. 6, the receiving device 200 includes a demodulation unit 201 and the distance measuring unit 202.

The demodulation unit 201 receives a delay analog impulse signal DAIP transmitted from the transmitting device 100 of FIG. 1 and demodulates it into a receive clock signal RCLK. Here, the delay analog impulse signal DAIP is a signal obtained when the analog impulse signal AIP (refer to FIGS. 3 and 5) is delayed by the delay time Δt (refer to Equation 1) due to the distance d (refer to FIG. 1). The receive clock signal RCLK is a signal obtained when the transmit clock signal TCLK (refer to FIGS. 3 and 5) is delayed by the delay time Δt due to the distance d.

The distance measuring unit 202 receives the receive clock signal RCLK from the demodulation unit 201. The distance measuring unit 202 measures the distance d using the delay time Δt of the receive clock signal RCLK and the transmit clock signal TCLK. In this case, the distance measuring unit 202 accurately measures the delay time Δt using a Time to Digital Converter (TDC) technique.

Figure 7:
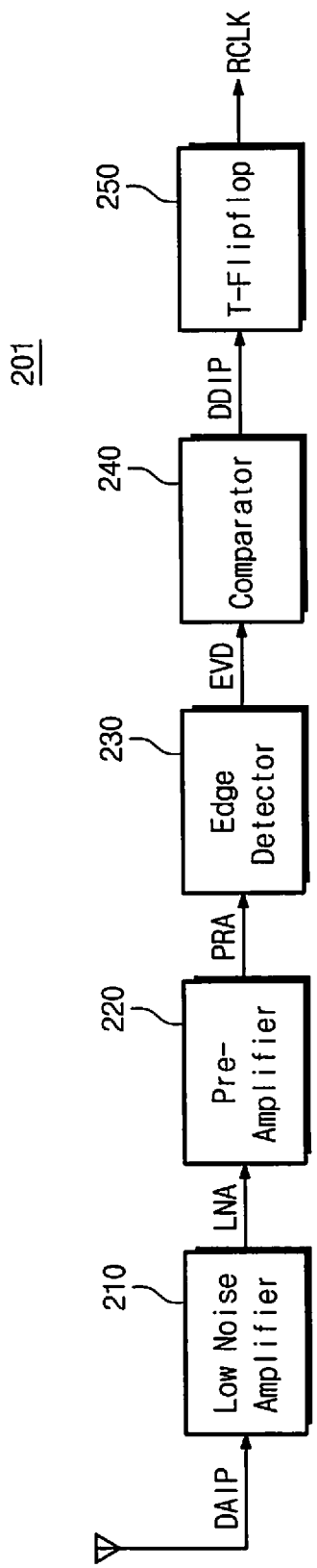
FIG. 7 is a block diagram illustrating the demodulation unit of FIG. 6.

FIG. 7 is a block diagram illustrating the demodulation unit 201 of FIG. 6. Referring to FIG. 7, the demodulation unit 201 may include a low noise amplifier 210, a pre-amplifier 220, an edge detector 230, a comparator 240, and a T-flipflop 250.

The low noise amplifier 210 receives a delay analog impulse signal DAIP and amplifies it. In this case, the low noise amplifier 210 may suppresses noise to the maximum, which occurs due to multipath fading. The low noise amplifier 210 outputs a low noise amplify signal LNA and transmits it to the pre-amplifier 220.

The pre-amplifier 220 receives the low noise amplify signal LNA from the low noise amplifier 210 and amplifies it. That is, the pre-amplifier 220 amplifies the low noise amplify signal LNA through a peak-to-peak method in order to compensates for the gain of the low noise amplify signal LNA. The pre-amplifier 220 outputs a pre-amplify signal PRA and transmits it to the edge detector 230.

The edge detector 230 receives the pre-amplify signal PRA from the pre-amplifier 220. The edge detector 230 detects the edge of the pre-amplify signal PRA, for example, a peak point of the pre-amplify signal PRA. The edge detector 230 outputs an edge detect signal EVD and transmits it to the comparator 240.

The comparator 240 receives the edge detect signal EVD from the edge detector 230. The comparator 240 compares the edge detect signal EVD with a reference level. For example, when the level of the edge detect signal EVD is lower than the reference level, the comparator 240 outputs '1'. When the level of the edge detect signal EVD is higher than the reference level, the comparator 240 outputs '0'.

That is, the comparator 240 converts the edge detect signal EVD into a delay digital impulse signal DDIP, that is, a digital signal. Here, the delay digital impulse signal DDIP is a signal delayed by the delay time Δt (refer to Equation 1) than the digital impulse signal DIP (refer to FIGS. 3 and 5). The comparator 240 transmits the delay digital impulse signal DDIP into the T-flipflop 250.

Moreover, the reference level of the comparator 240 may be appropriately selected to minimize multipath fading influence. That is, the reference level of the comparator 240 is configured to be higher than a level of noise occurring due to multipath fading and lower than a level of a signal generated through a direct path.

The T-flipflop 250 receives the delay digital impulse signal DDIP from the comparator 240. The T-flipflop 250 generates a receive clock signal RCLK using a rising edge of the delay digital impulse signal DDIP. For example, the T-flipflop 250 maintains a value between the rising edges of the delay digital impulse signal DDIP as '1' to generate the receive clock signal RCLK.

Figure 8:
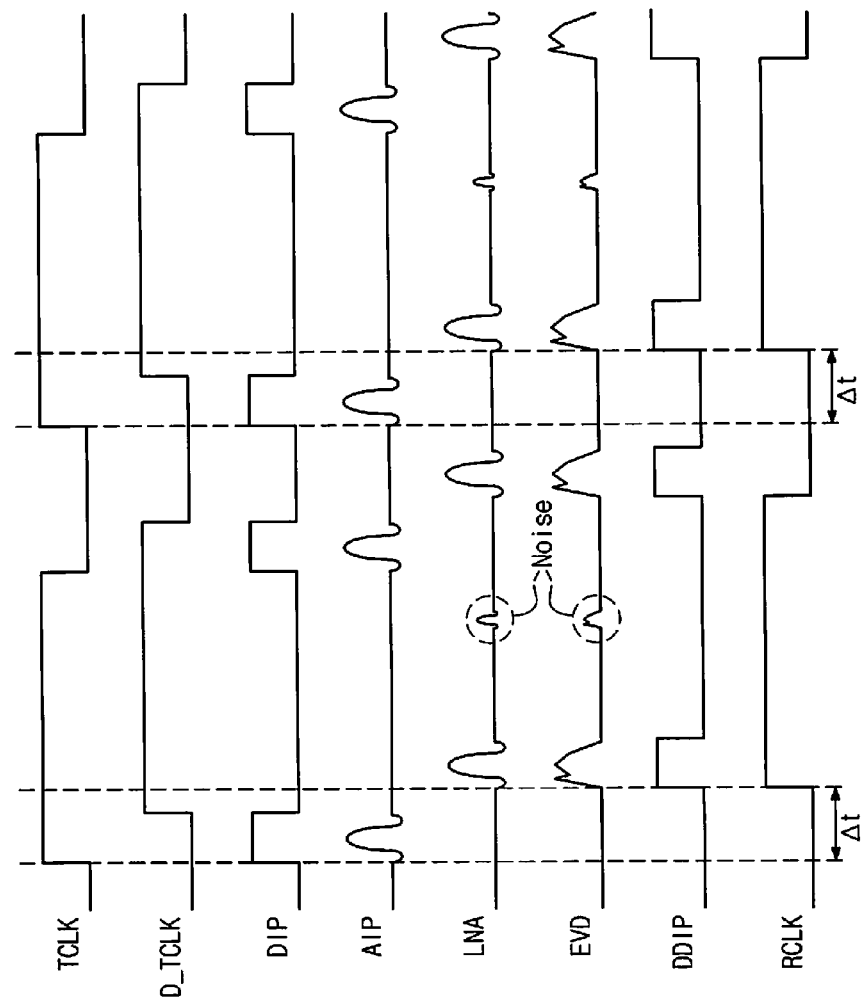
FIG. 8 is a timing diagram illustrating an operation of the demodulation unit of FIG. 6.

FIG. 8 is a timing diagram illustrating an operation of the demodulation unit 201 of FIG. 6. In order to show the delay time Δt between a transmit clock signal TCLK and a receive clock signal RCLK, the transmit clock signal TCLK of FIG. 5 is shown in FIG. 8.

Referring to FIGS. 7 and 8, the low noise amplifier 210 receives a delay analog impulse signal DAIP from an antenna and outputs a low noise amplify signal LNA. The low noise amplify signal LNA is converted into an edge detect signal EVD through the pre-amplifier 220 and the edge detector 230. The edge detect signal EVD is converted into a delay digital impulse signal DDIP through the comparator 240.

In this case, since a reference level of the comparator 240 is configured to be higher than a noise level of the edge detect signal EVD, multipath fading is minimized. Furthermore, since a leading pulse among pulses of the delay digital impulse signal DDIP is used to measure the delay time Δt, multipath fading is minimized.

The delay digital impulse signal DDIP is converted into a receive clock signal RCLK through the T-flipflop 250. In this case, a rising edge of the receive clock signal RCLK and a rising edge of the transmit clock signal TCLK have a time difference by the delay time Δt. Accordingly, by measuring the delay time Δt, the distance measuring system 10 FIG. 1 may calculate the distance d (refer to FIG. 1) according to an embodiment of the present invention. Hereinafter, the distance measuring unit 202 of FIG. 6 measuring the delay time Δt accurately will be described in more detail.

Figure 9:
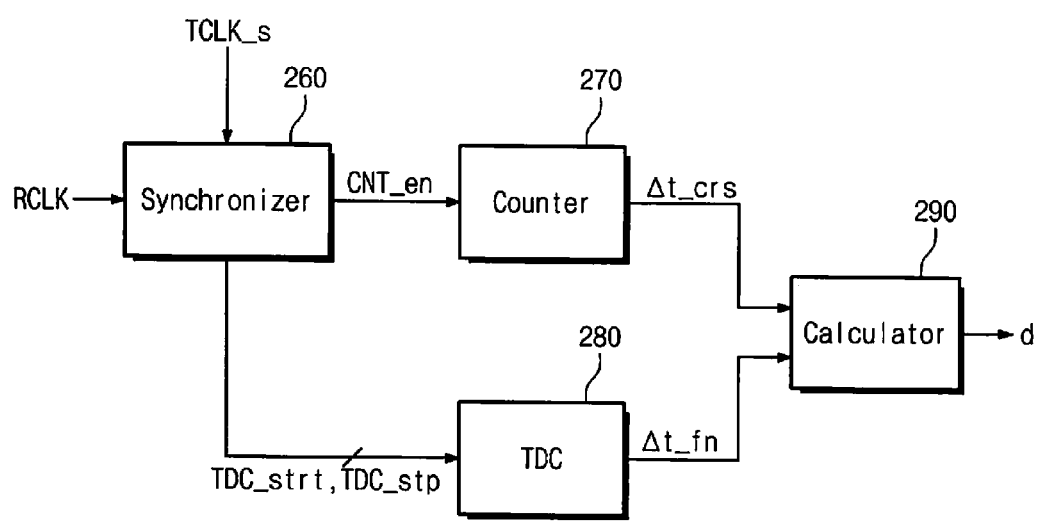
FIG. 9 is a block diagram illustrating the distance measuring unit of FIG. 6.

FIG. 9 is a block diagram illustrating the distance measuring unit 202 of FIG. 6. Referring to FIG. 9, the distance measuring unit 202 may include a synchronizer 260, a counter 270, a TDC 280, and a calculator 290.

The synchronizer 260 receives a receive clock signal RCLK from the demodulation unit 201 (refer to FIG. 6). The synchronizer 160 receives a clock signal TCLK_s (hereinafter, referred to as a transmit clock) synchronized with a transmit clock signal TCLK from an external. That is, the transmit clock signal TCLK_s and the receive clock signal RCLK have a time difference of a delay time Δt.

The synchronizer 260 is used to interlock the counter 270 and the TDC 280. That is, the synchronizer 260 outputs a signal CNT_en for controlling the counter 270 and signals TDC_strt and TDC_stp for controlling the TDC 280 in response to the rising edges of the transmit clock signal TCLK_s and the receive clock signal RCLK.

The counter 270 receives the counter enable signal CNT_en from the synchronizer 260. The counter 270 measures a course delay time Δt_crs in response to the counter enable signal CNT_en. That is, in order to measure the delay time Δt fast, the counter 270 measures the course delay time Δt_crs.

The TDC 280 receives a TDC start signal TDC_strt and a TDC stop signal TDC_stp from the synchronizer 260. The TDC 280 measures a fine delay time Δt_fn in response to the TDC start signal TDC_strt and the TDC stop signal TDC_stp. That is, in order to measure the delay time Δt accurately, the TDC 280 measures the fine delay time Δt_fn. In this case, the TDC 280 and the counter 280 may operate in parallel.

The calculator 290 receives the course delay time Δt_crs and the fine delay time Δt_fn from the counter 270 and the TDC 280, respectively. The calculator 270 subtracts the fine delay time Δt_fn from the course delay time Δt_crs to calculate the delay time Δt. This will be expressed as the following Equation 3.

MathFigure 3

$$\Delta t = \Delta t\_crs - \Delta t\_fn \qquad [\text{Math.3}]$$

The calculator 290 may calculate the distance d (refer to FIG. 1 and Equation 1) using the delay time Δt.

Figure 10:
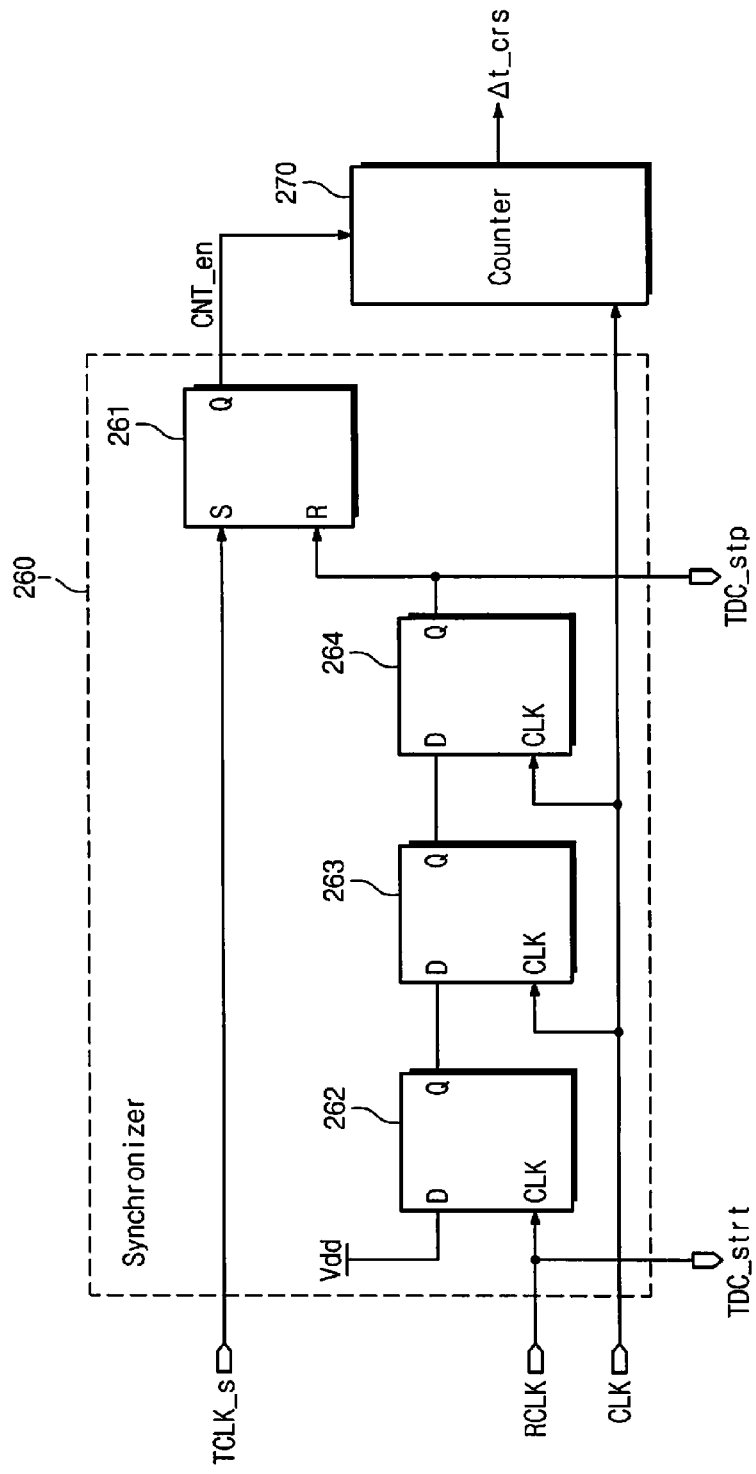
FIG. 10 is a block diagram illustrating the synchronizer and the counter of FIG. 9.

FIG. 10 is a block diagram illustrating the synchronizer 260 and the counter 270 of FIG. 9. Referring to FIG. 10, the synchronizer 260 may include an S-R latch 261 and a plurality of D-flipflops 262 to 264.

A transmit clock signal TCLK_s is applied to the set terminal S of the S-R latch 261 and an output signal of the D-flipflop 264 is applied to the reset terminal R of the S-R latch 261. The S-R latch 261 generates a counter enable signal CNT_en in response to the transmit clock signal TCLK_s and an output of the third D-flipflop 264 and transmits the generated counter enable signal CNT_en to the counter 270.

A power voltage Vdd is applied to the input terminal D of the first D-flipflop 262 and a receive clock signal RCLK is applied to the clock terminal CLK. The output terminal Q of the first D-flipflop 262 is connected to the input terminal D of the second D-flipflop 263.

The input terminal D of the second D-flipflop 263 and the input terminal D of the third D-flipflop 264 are connected to the output terminal Q of the first D-flipflop 262 and the output terminal Q of the second D-flipflop 263, respectively. A clock signal CLK is provided to the clock terminals CLK of the second D-flipflop 263 and the third D-flipflop 264. Here, the clock signal CLK have a higher frequency than the receive clock signal RCLK and the transmit clock signal TCLK_s.

The counter 270 receives the counter enable signal CNT_en and the clock signal CLK. The counter 270 counts the clock signals CLK when the counter enable signal CNT_en is in a high level H to calculate a course delay time Δt_crs.

Moreover, the synchronizer 260 of FIG. 10 is realized with the S-R latch 261 and the D-flipflops 262 to 264. However, this is just exemplary and the technical ideas of the present invention are not limited thereto. For example, the synchronizer 260 may be realized with various logic gates and the number of D-flipflops may vary.

Figure 11:
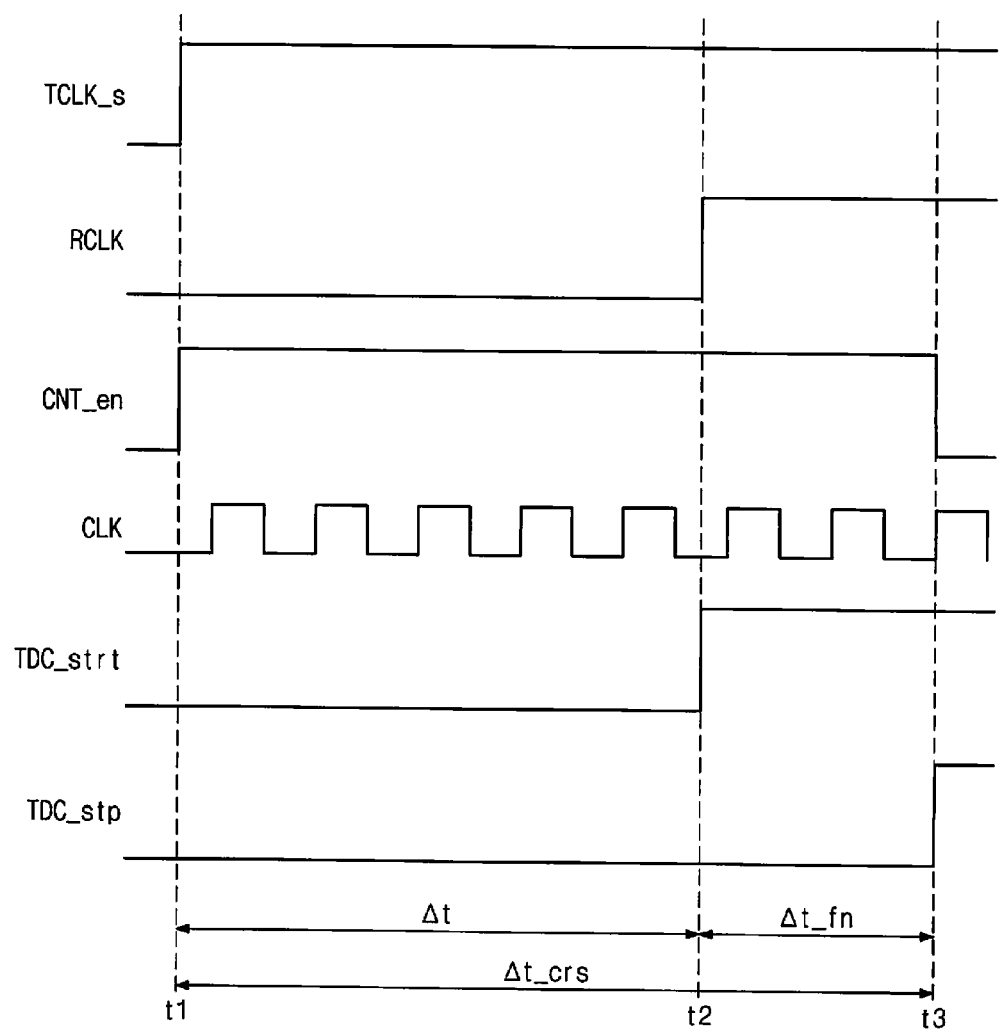
FIG. 11 is a timing diagram illustrating operations of the synchronizer and the counter of FIG. 10.

FIG. 11 is a timing diagram illustrating operations of the synchronizer 260 and the counter 270 of FIG. 10. Hereinafter, referring to FIGS. 10 and 11, operations of the synchronizer 260 and the counter 270 will be described in more detail.

At the first timing t1, a transmit clock signal TCLK_s shifts from logic low L into logic high H. In this case, the S-R latch 261 shifts the counter enable signal CNT_en from logic low L into logic high H in response to the transmit clock signal TCLK_s of logic high H. The counter 270 counts the clock signals in response to the counter enable signal CNT_en of logic high H. For example, the counter 270 starts to count the rising edges of the clock signal CLK.

At the second timing t2, the receive clock signal RCLK shifts from logic low L to logic high H. In this case, the receive clock signal RCLK of logic high H is applied to the clock terminal of the first D-flipflop 262. Accordingly, the first D-flipflop 262 outputs a power voltage Vdd and transmits it to the input terminal D of the second D-flipflop 263. The second D-flipflop 263 delays the block signal CLK of the power voltage Vdd by one period and transmits it to the third D-flipflop 264. The third D-flipflop 264 delays the power voltage Vdd by one period of the clock signal CLK and transmits it to the reset terminal R of the S-R latch 261.

At the third timing t3, the power voltage Vdd is applied to the reset terminal R of the S-R latch 261. That is, a signal of logic high H is applied to the reset terminal R of the S-R latch 261. In this case, the S-R latch 261 shifts the counter enable signal CNT_en from logic high H into logic low L. The counter 270 stops the counting of the clock signals CLK in response to the counter enable signal CNT_en of logic low L.

As mentioned above, the counter 270 counts the clock signals CLK during the first to third timings t1 to t3 to measure a course delay time Δt_crs. In this case, a calculation speed of the course delay time Δt_crs may be adjusted by adjusting the period of the clock signal CLK.

Meanwhile, as shown in FIGS. 10 and 11, the receive clock signal RCLK and an output signal of the third D-flipflop 264 are used as a TDC start signal TDC_strt and a TDC stop signal TDC_stp, respectively.

Since the receive clock signal RCLK shifts from logic low L into logic high H at the second timing t2, the TDC start signal TDC_strt shifts from logic low L into logic high H at the second timing t2. Additionally, since the output signal of the third D-flip-flop 264 is changed into a power voltage Vdd at the third timing t3, the TDC stop signal TDC_stp shifts from logic low L into logic high H at the third timing t3.

Accordingly, the TDC 280 of FIG. 9 may measure the fine delay time Δt_fn in response to the TDC start signal TDC_strt and the TDC stop signal TDC_stp. The calculator 290 of FIG. 9 subtracts the fine delay time Δt_fn from the course delay time Δt_crs to calculate the delay time Δt. Hereafter, in order to measure the fine delay time Δt_fn, a structure and operations of the TDC 280 of FIG. 9 will be described in more detail.

Figure 12:
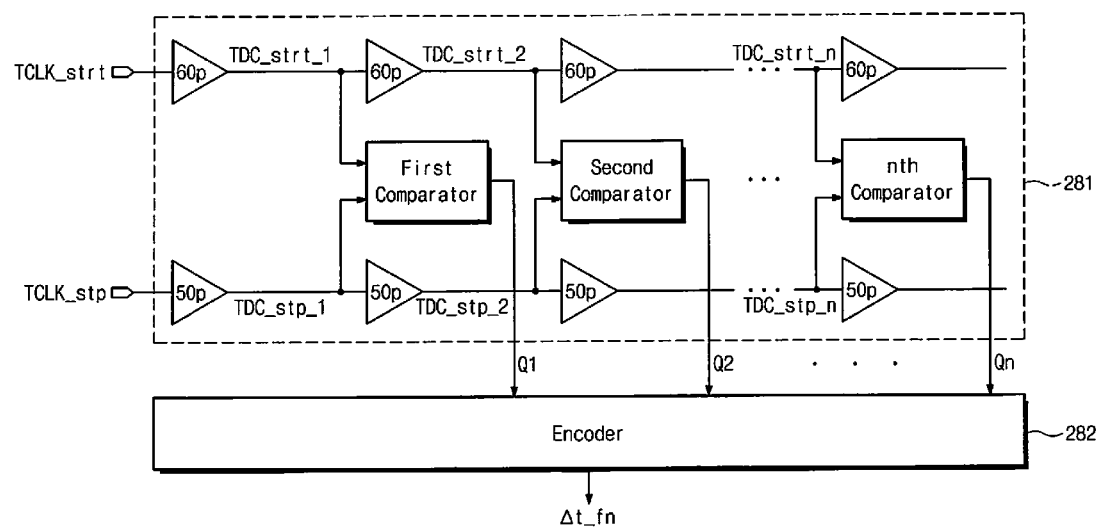
FIG. 12 is a block diagram illustrating the TDC of FIG. 9.

FIG. 12 is a block diagram illustrating the TDC 280 of FIG. 9. Referring to FIG. 12, the TDC 280 includes a delay comparison block 281 and an encoder 282.

The delay comparison block 281 includes a plurality of inverters and comparators. The delay comparison block 281 delays the TDC start signal TDC_strt and the TDC stop signal TDC_stp by respectively different intervals and then, compares them.

In more detail, the inverters form respectively different delay lines. For example, it is assumed that the inverters corresponding to the TDC start signal TDC_strt form delay lines, which delay respective input signals by 60 p and continuously delay the TDC start signal TDC_strt at the time interval of 60 p. It is assumed that the inverters corresponding to the TDC stop signal TDC_stp form delay lines, which delay respective input signals by 50 p and continuously delay the TDC start signal TDC_strt at the time interval of 50 p. However, there are just exemplary and the technical ideas of the present invention are not limited thereto.

The first to n comparators receive the TDC start signal TDC_strt and the TDC stop signal TDC_stp, which are delayed by respectively different time intervals. The first to n comparators compares whether a rising edge of the received TDC stop signal TDC_stp has priority over a rising edge of the TDC start signal TDC_strt and then provides a comparison result to the encoder 282.

For example, the first comparator receives a first TDC start signal TDC_str_1 delayed by 60 p than the TDC start signal TDC_strt and a first TDC stop signal TDC_stp delayed by 50 p than the TDC stop signal TDC_stp. The first comparator compares whether a rising edge of the first TDC stop signal TDC_stp has priority over a rising edge of the first TDC start signal TDC_strt_1. For example, if the rising edge of the first TDC stop signal TDC_stp does not have priority over the rising edge of the first TDC start signal TDC_strt_1, the first comparator outputs '1'(i.e., Q=1). For example, if the rising edge of the first TDC stop signal TDC_stp has priority over the rising edge of the first TDC start signal TDC_strt_1, the first comparator outputs '0'(i.e., Q=0).

The encoder 282 receives the output values Q1 to Qn of the first to n comparators in the delay comparison block 281. The encoder 282 encodes the output values Q1 to Qn of the first to n comparators to output a fine delay time Δt_fn.

Figure 13:
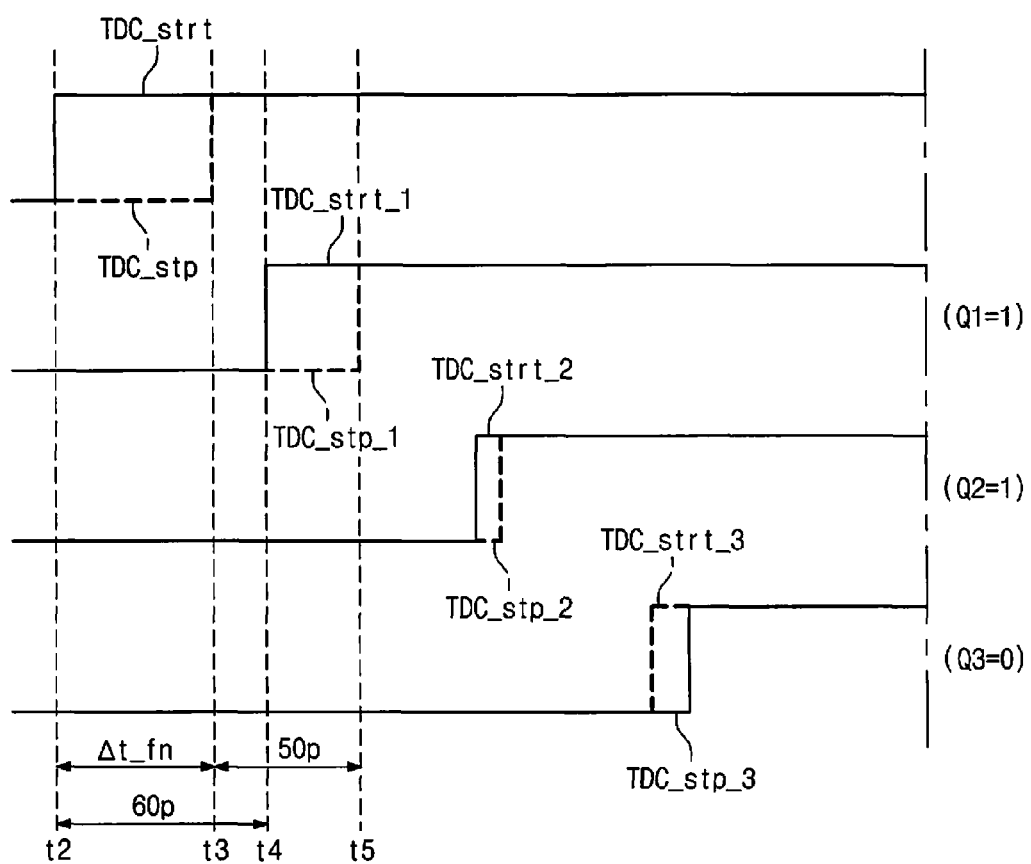
FIG. 13 is a timing diagram illustrating an operation of the TDC of FIG. 9.

FIG. 13 is a timing diagram illustrating an operation of the TDC 280 of FIG. 9. In FIG. 13, it is assumed that a rising edge of the third TDC stop signal TDC_stp_3 has priority over a rising edge of the third TDC start signal TDC_strt_3. Hereinafter, refer to FIGS. 12 and 13, an operation of the TDC 280 of FIG. 9 will be described in more detail.

At the second timing t2, the TDC start signal TDC_strt shifts from logic low L into logic high H and, at the third timing t3, the TDC stop signal TDC_stp shifts from logic low L into logic high H. That is, the rising edge of the TDC start signal TDC_strt is positioned at the second timing t2 and the rising edge of the TDC stop signal TDC_stp is positioned at the third timing t3. In this case, a time difference between the second timing t2 and the third timing t3 is assumed as the fine delay time Δt_fn as shown in FIG. 11.

First, the TDC start signal TDC_strt is delayed by 60 p through an inverter. That is, the inverter outputs a first TDC start signal TDC_strt_1 delayed by 60 p than the TDC start signal TDC_strt. Additionally, the TDC stop signal TDC_stp is delayed by 50 p through an inverter. That is, the inverter outputs a first TDC stop signal TDC_stp_1 delayed by 50 p than the TDC stop signal TDC_stp. In this case, the rising edges of the first TDC start signal TDC_strt_1 and the first TDC stop signal TDC_stp_1 are positioned at the fourth timing t4 and the fifth timing t5, respectively.

In this case, the first comparator compares whether a rising edge of the first TDC stop signal TDC_stp_1 has priority over a rising edge of the first TDC start signal TDC_strt_1. Since the rising edge of the first TDC stop signal TDC_stp_1 does not have priority over the rising edge of the first TDC start signal TDC_strt_1, the first comparator outputs '1'(i.e., Q1=1).

Later, in the same manner, the first TDC start signal TDC_strt_1 and the first TDC stop signal TDC_stp_1 are delayed by 60 p and 50 p, respectively. Accordingly, a second TDC start signal TDC_strt_2 and a second TDC stop signal TDC_stp_2 are delayed by 120 p and 100 p, respectively, than the first TDC start signal TDC_strt_1 and the first TDC stop signal TDC_stp_1. The rising edges of the second TDC start signal TDC_strt_2 and the second TDC stop signal TDC_stp_2 are positioned at the sixth timing t6 and the seventh timing t7. Since the rising edge of the second TDC stop signal TDC_stp_2 does not have priority over the rising edge of the second TDC start signal TDC_strt_2, the second comparator outputs '1'(i.e., Q2=1).

Later, in the same manner, a third TDC start signal TDC_strt_3 and a third TDC stop signal TDC_stp_3 are delayed by 180 p and 150 p, respectively, than the TDC start signal TDC_strt and the TDC stop signal TDC_stp. In this case, the rising edge of the third TDC stop signal TDC_stp_3 has priority over the rising edge of the third TDC start signal TDC_strt_3. Accordingly, the comparator outputs '0'.(i.e., Q3=0).

Moreover, referring to FIG. 12, the encoder 282 receives the output values Q1 to Qn of the comparators from the delay comparison block 281. The encoder 282 decodes the received output values of the comparators to output a fine delay time Δt_fn. For example, if Q3=0, the fine delay time Δt_fn may have about 20 p to about 30 p.

Moreover, as described with reference to FIG. 9, the calculator 290 subtracts the fine delay time Δt_fn measured by the TDC 280 from the course delay time Δt_crs measured by the counter 270 to measure the delay time Δt. The calculator 290 may calculates the accurate distance d (refer to FIG. 1) using the measured delay time Δt.

Moreover, although this specification of the present invention describes specific embodiments, various modifications are possible within the technical scopes of the present invention. For example, structures and operations of the TDC according to embodiments of the present invention may be diversely applied and used. For example, TDCs having various structures such as a digital delay line TDC, a vernier delay TDC, a time shrinking TDC, a resistor interpolation TDC, and a time-amplifier TDC may be applied to a variety of embodiments of the present invention.

Furthermore, the distance measuring system according to embodiments of the present invention may be modified within the technical scopes of the present invention. For example, the distance measuring unit 202 of FIG. 9 may measure distance by using only TDC technique. Specifically, the distance measuring unit 202 may not have counter 270. And TDC 280 of the distance measuring unit may receive the transmit clock signal TCLK_s and the receive clock signal RCLK. The TDC 280 may measure a time difference of a delay time Δt between the transmit clock signal TCLK_s and the receive clock signal RCLK through TDC technique.

Furthermore, the distance measuring system according to embodiments of the present invention may be applied to various fields. For example, the distance measuring system may be applied to an apparatus for measuring compression depth in cardiopulmonary resuscitation.

According to recommendations for cardiopulmonary resuscitation from international liaison committee on resuscitation, the compression depth should be maintained in a range of about 4 cm to about 5 cm during cardiopulmonary resuscitation. However, during an actual cardiopulmonary resuscitation, it is reported that the compression depth suggested by the above recommendations may not be maintained.

When the distance measuring system according to embodiments of the present invention is applied to an apparatus for measuring compression depth in cardiopulmonary resuscitation, it could be accurately measured whether the compression depth in cardiopulmonary resuscitation meets the suggested recommendations. In FIGS. 14 to 17, application examples that the distance measuring system according to embodiments of the present invention is applied to an apparatus for measuring compression depth in cardiopulmonary resuscitation will be described in more detail.

Mode for the Invention

Figure 14:
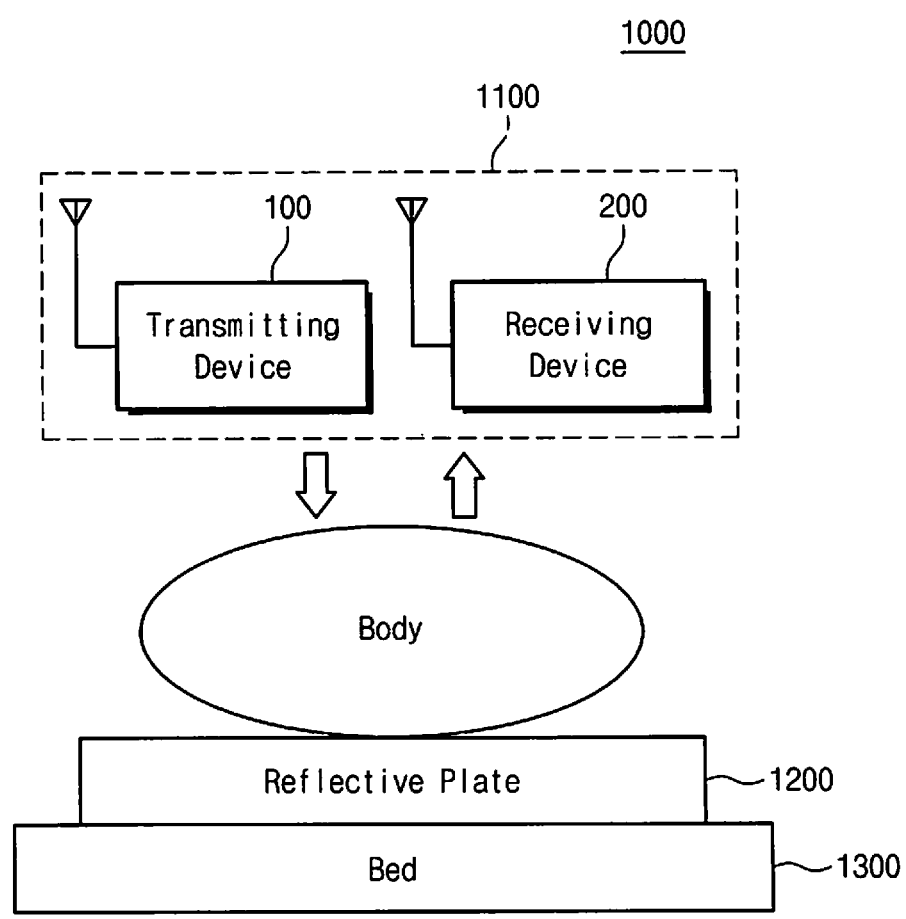
FIGS. 14 and 15 are views illustrating application examples when the transmitting device and the receiving device of the distance measuring system using a radar technique are applied to a system for measuring compression depth in cardiopulmonary resuscitation.
Figure 15:
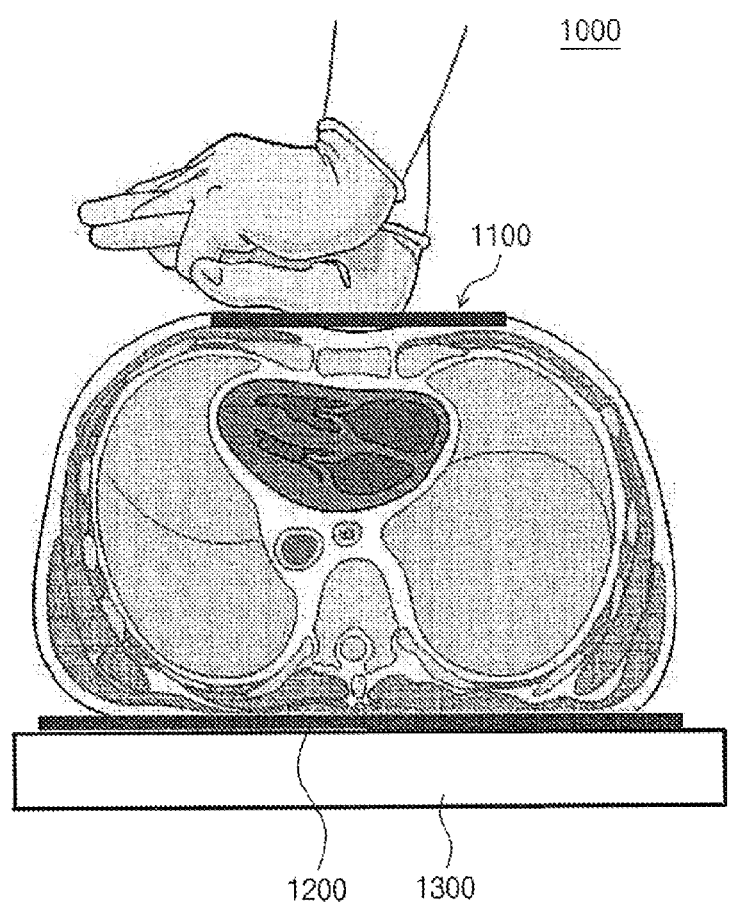

FIGS. 14 and 15 are views illustrating application examples when the transmitting device 100 and the receiving device 200 of the distance measuring system 10 using a radar technique are applied to a system 1000 for measuring compression depth in cardiopulmonary resuscitation.

Referring to FIG. 14, the system 1000 for measuring compression depth in cardiopulmonary resuscitation includes a transmitting device 100, a receiving device 200, a reflective plate 1200, and a bed 1300. The transmitting device 100 has the same configuration as that 100 of FIG. 1 and the receiving device 200 has the same configuration as that 200 of FIG. 2.

The transmitting device 100 and the receiving device 200 may be integrally built in the pad 1100. The pad 1100 may be formed with a thin plate to be disposed on the chest of a body. In addition to the transmitting device 100 and the receiving device 200, the pad 100 may further include a display device for displaying the compression depth and a key input unit for inputting commands of a user.

The transmitting device 100 transmits a wireless signal to a body. The reflective plate 1200 is disposed at the back of the body and reflects the wireless signal transmitted from the transmitting device 100. The receiving device 200 receives the wireless signal reflected by the reflective plate 1200 and measures a delay time between the wireless signal transmitted from the transmitting device 100 and the wireless signal received by the receiving device 200. Accordingly, as shown in FIG. 15, during an actual cardiopulmonary resuscitation, the compression depth may be accurately measured. The configurations and operational principles of the transmitting device 100 and the receiving device 200 are identical to those of FIGS. 1 to 13, and thus their detailed descriptions will be omitted.

Figure 16:
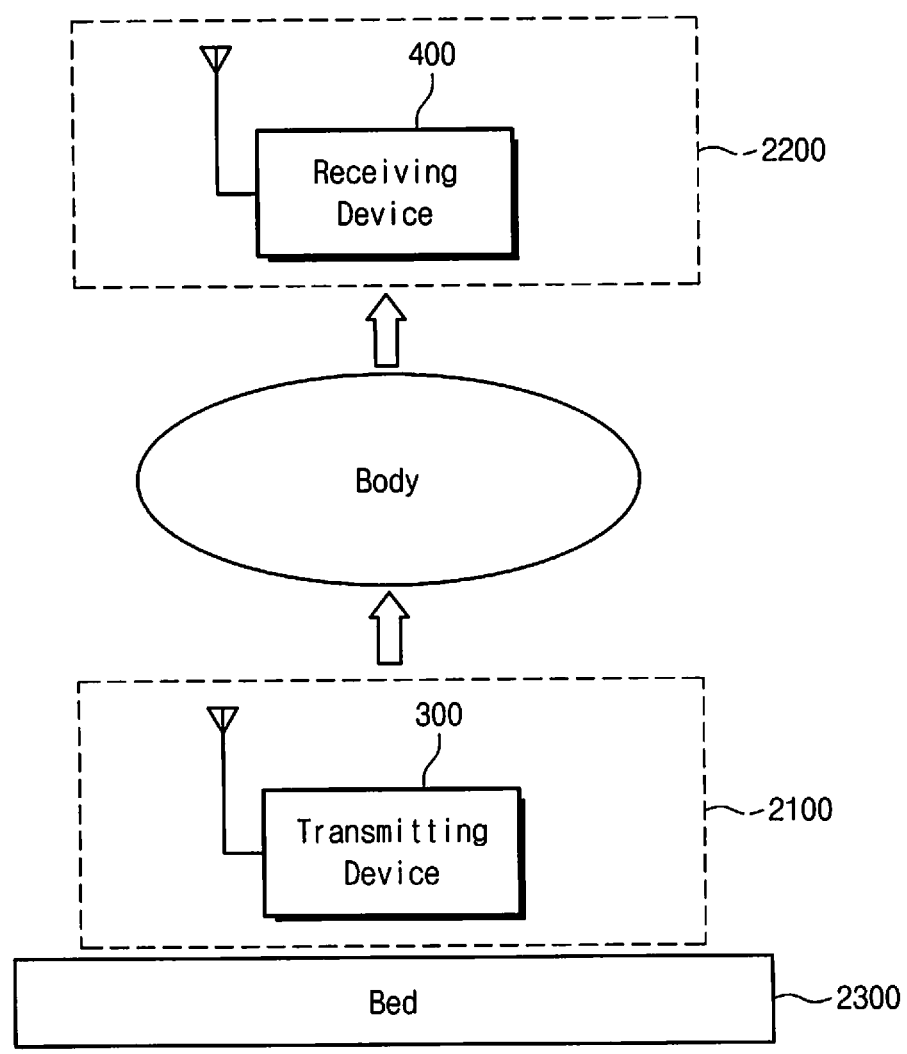
FIGS. 16 and 17 are views illustrating application examples when the transmitting device and the receiving device of the distance measuring system using a transceiver technique are applied to a system for measuring compression depth in cardiopulmonary resuscitation.
Figure 17:
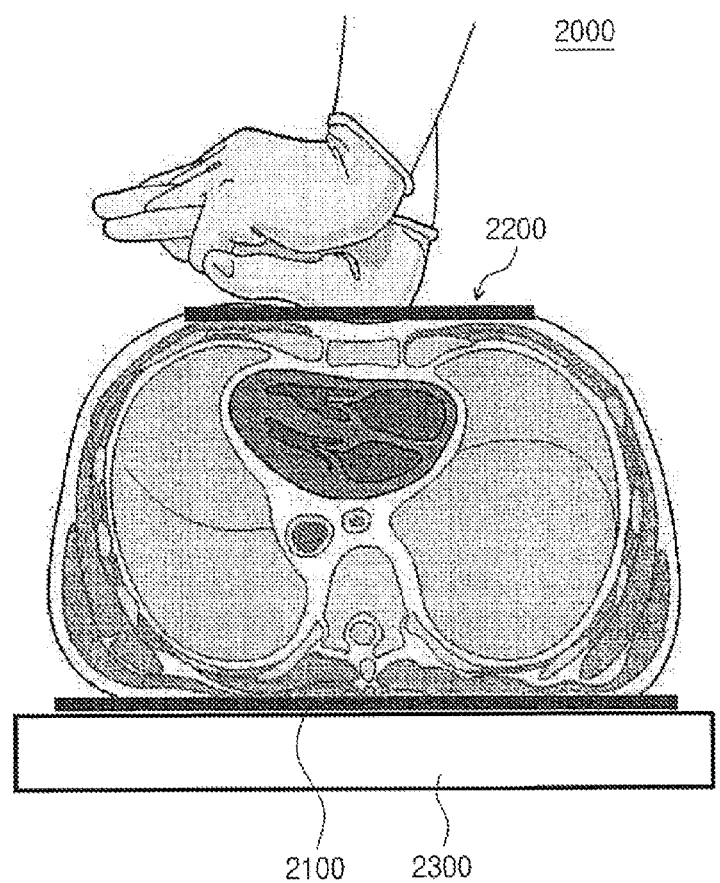

FIGS. 16 and 17 are views illustrating application examples when the transmitting device 300 and the receiving device 400 of the distance measuring system 20 using a transceiver technique are applied to a system 2000 for measuring compression depth in cardiopulmonary resuscitation. Since the system 2000 for measuring compression depth in cardiopulmonary resuscitation is similar to that 1000 of FIGS. 14 and 15, their differences are mainly described hereinafter.

Referring to FIG. 16, the system 2000 for measuring compression depth in cardiopulmonary includes the transmitting device 300, the receiving device 400, and a bed 2300.

The transmitting device 300 and the receiving device 400 may be formed with respective pads 2100 and 2200 having a thin plate structure. The transmitting device 300 has the same structure as that 300 of FIG. 2 and the receiving device 400 has the same structure as that 400 of FIG. 2. In addition to the receiving device 400, the pad 2200 may further include a display device for displaying the compression depth and a key input unit for inputting commands of a user. The pad 2200 may be disposed on the chest of a body and the pad 2100 may be disposed on the back of a body.

The transmitting device 300 transmits a wireless signal to a body and the receiving device 400 receives the transmitted wireless signal. The receiving device 400 measures a delay time between the transmitted wireless signal and the received wireless signal in order to measure the compression depth. Accordingly, as shown in FIG. 17, during an actual cardiopulmonary resuscitation, the compression depth may be accurately measured.

Moreover, the distance measuring system may be applied to an actual cardiopulmonary resuscitation and a train for cardiopulmonary resuscitation. For example, the distance measuring system may be applied to a training mannequin for cardiopulmonary resuscitation. This will be described in more detail with reference to FIGS. 18 to 20.

Figure 18:
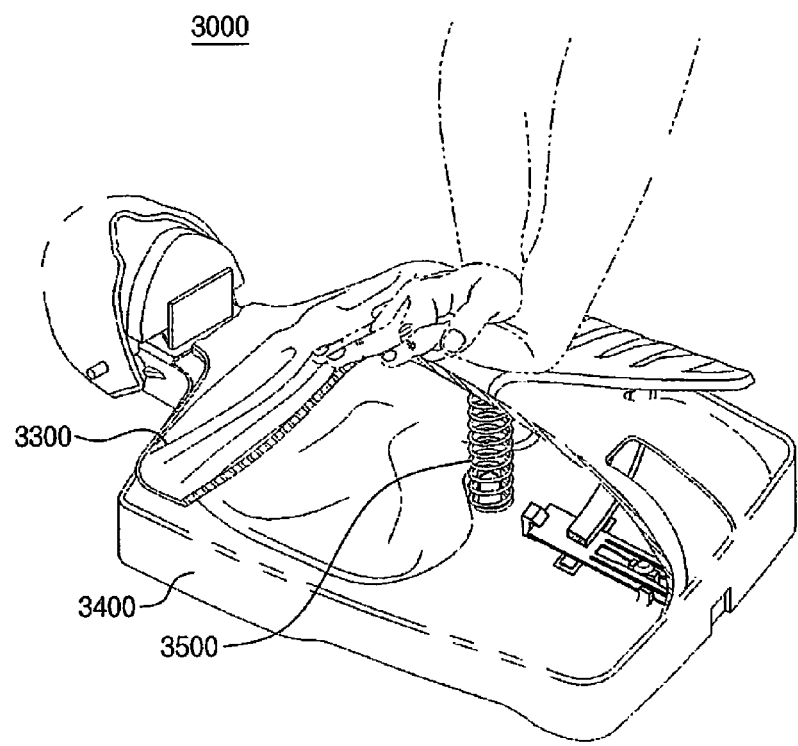
FIG. 18 is a perspective view illustrating a training mannequin for cardiopulmonary resuscitation with the distance measuring system according to an embodiment of the present invention.
Figure 19:
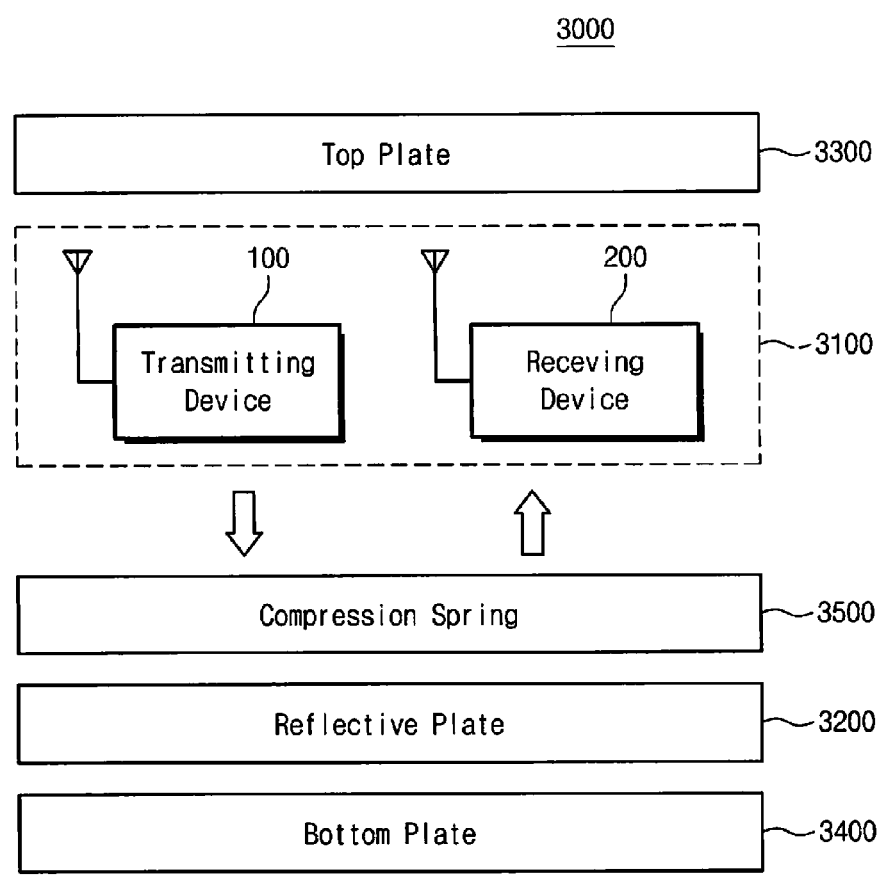
FIG. 19 is a sectional view illustrating an internal configuration of the training mannequin of FIG. 18.

FIG. 18 is a perspective view illustrating a training mannequin 3000 for cardiopulmonary resuscitation with the distance measuring system according to an embodiment of the present invention. FIG. 19 is a sectional view illustrating an internal configuration of the training mannequin 3000 of FIG. 18.

Referring to FIGS. 18 and 19, the training mannequin 3000 for cardiopulmonary resuscitation includes a transmitting device 100, a receiving device 200, a reflective plate 3200, a top plate 3300, a bottom plate 3400, and a compression spring 3500. The transmitting device 100 corresponds to that 100 of FIG. 1 and the receiving device 200 corresponding to that 200 of FIG. 1. The transmitting device 100 and the receiving device 200 are integrally built in the pad 3100.

The top plate 3300 represents the chest of a body and the bottom plate 3400 represents the back of a body. The compressing spring 3500 has an elastic property corresponding to an external force of the top plate 3300 during cardiopulmonary resuscitation. During cardiopulmonary resuscitation, the wireless signal transmitted from the transmitting device 100 is reflected by the reflective plate 3200 and the reflected wireless signal is received by the receiving device 200. The receiving device 200 measures a delay time between the transmitted wireless signal and the received wireless signal to measure the compression depth. The configurations and operational principles of the transmitting device 100 and the receiving device 200 are identical to those of FIGS. 1 to 13, and thus their detailed descriptions will be omitted.

Figure 20:
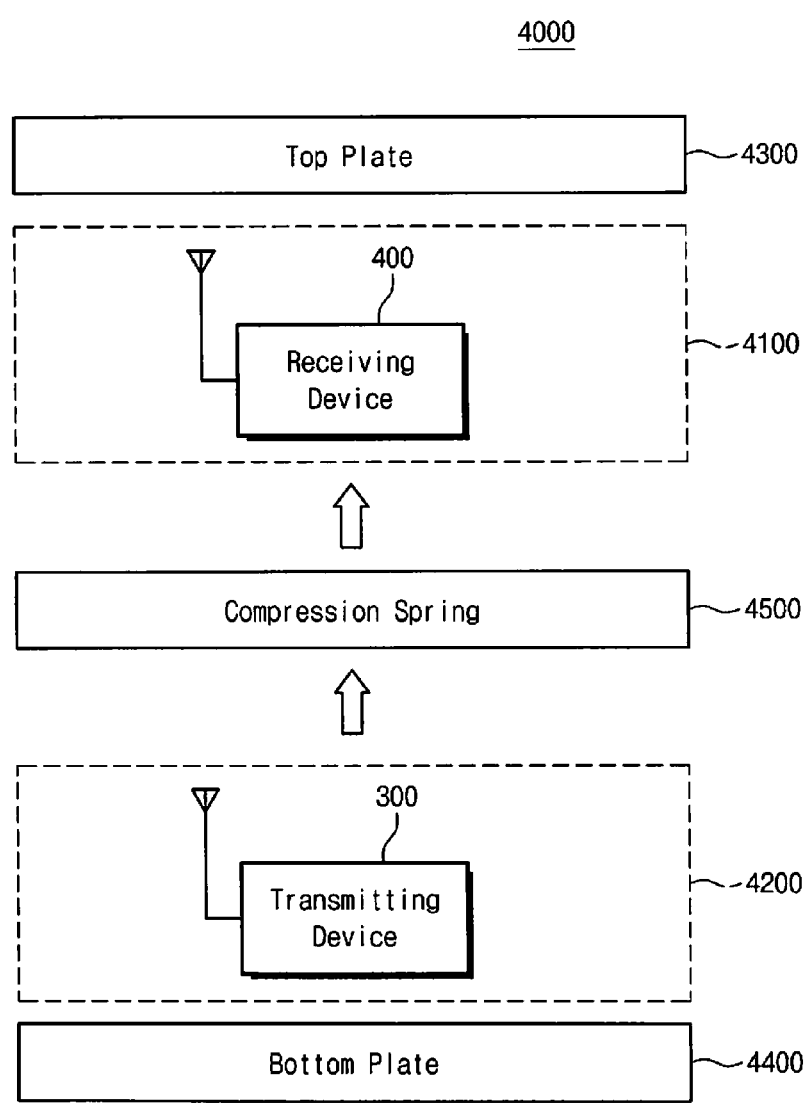
FIG. 20 is a perspective view illustrating a training mannequin for cardiopulmonary resuscitation with the distance measuring system according to another embodiment of the present invention.

FIG. 20 is a perspective view illustrating a training mannequin 4000 for cardiopulmonary resuscitation with the distance measuring system according to another embodiment of the present invention. Since the internal configuration of the training mannequin 4000 of FIG. 20 is similar to that of the training mannequin 3000, their differences are mainly described hereinafter.

Referring to FIG. 20, the training mannequin 4000 for cardiopulmonary resuscitation includes a top plate 4300 and a bottom plate 4400, which represent the chest and the back of a body, respectively. The transmitting device 300 and the receiving device 400 may be formed with respective pads 4100 and 4200 and may be disposed under the top plate 4300 and the on the bottom plate 4400. The transmitting device 300 corresponds to that 300 of FIG. 2 and the receiving device 400 corresponds to that 400 of FIG. 2. The transmitting and receiving devices 300 and 400 measure the compression depth using a transceiver technique during cardiopulmonary resuscitation. Since this is similar to that of FIGS. 16 and 17, its detailed description will be omitted.

As mentioned above, the distance measuring system according to an embodiment of the present invention may be applied to the distance measuring system or training mannequin for cardiopulmonary resuscitation. However, this is just exemplary and application examples of the present invention are not limited thereto. For example, the distance measuring system according to an embodiment of the present invention may be applied to a position recognizing system. For example, the distance measuring system according to an embodiment of the present invention may be applied to a system for recognizing a spatial position of a target by measuring distances between the target and at least three nodes.

According to embodiments of the present invention, the distance measuring system combines an IR-UWB method with a TDC method to measure a distance accurately.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

Industrial Applicability

Structures and operations of the TDC according to embodiments of the present invention may be diversely applied and used. For example, TDCs having various structures such as a digital delay line TDC, a vernier delay TDC, a time shrinking TDC, a resistor interpolation TDC, and a time-amplifier TDC may be applied to a variety of embodiments of the present invention.

Furthermore, the distance measuring system according to embodiments of the present invention may be applied to various fields. For example, the distance measuring system may be applied to an apparatus for measuring compression depth in cardiopulmonary resuscitation.

According to recommendations for cardiopulmonary resuscitation from international liaison committee on resuscitation, the compression depth should be maintained in a range of about 4 cm to about 5 cm during cardiopulmonary resuscitation. However, during an actual cardiopulmonary resuscitation, it is reported that the compression depth suggested by the above recommendations may not be maintained.

The invention claimed is:

1. A distance measuring device comprising:
    a transmitting device transmitting an impulse signal; and
    a receiving device receiving the impulse signal and measuring a delay time between a transmitting timing and a receiving timing of the impulse signal,
    wherein the receiving device measures the delay time through a Time to Digital Converter (TDC) technique.

2. The distance measuring device of claim 1, wherein the receiving device measures the delay time by delaying a first signal synchronized at the transmitting timing of the impulse signal and a second signal synchronized at the receiving timing of the impulse signal, with respectively different time intervals.

3. The distance measuring device of claim 2, wherein the first signal is delayed by a first time interval and the second signal is delayed by a second time interval shorter than the first time interval.

4. The distance measuring device of claim 3, wherein the first and second time intervals are longer than the delay time.

5. The distance measuring device of claim 1, wherein the transmitting device comprises:
    a transmit clock signal generator generating a transmit clock signal;
    an impulse generator converting the transmit clock signal into a digital impulse signal; and
    a signal distortion filter converting the digital impulse signal into the impulse signal.

6. The distance measuring device of claim 5, wherein the impulse generator comprises at least one inverter and at least one XOR gate.

7. The distance measuring device of claim 1, wherein the receiving device comprises:
    a counter measuring a course delay time between a first signal synchronized at the transmitting timing of the impulse signal and a third signal activated later than a second signal, the second signal synchronized at the receiving timing of the impulse signal; and
    a TDC measuring a fine delay time between the second signal and the third signal.

8. The distance measuring device of claim 7, further comprising a synchronizer controlling the counter and the TDC in response to the first and second signals.

9. The distance measuring device of claim 8, wherein the synchronizer comprises at least one latch and at least one flip-flop.

10. The distance measuring device of claim 7, further comprising a calculator measuring the delay time by subtracting the fine delay time from the course delay time.

11. A distance measuring device comprising:
a transmitting device transmitting an impulse signal; and
a receiving device receiving the impulse signal and measuring a time interval between as a transmitting timing and a receiving timing of the impulse signal,
wherein the receiving device comprises:
a demodulation unit demodulating the received impulse signal into a receive clock signal; and
a distance measuring unit measuring a delay time between a transmit clock signal synchronized at the transmitting time of the impulse signal and the receive clock signal through a TDC technique.

12. The distance measuring device of claim 11, wherein the distance measuring unit measures the delay time by delaying the transmit clock signal and the receive clock signal with respectively different time intervals.

13. The distance measuring device of claim 12, wherein the distance measuring unit comprises:
a counter measuring a course delay time between the transmit clock signal and a TDC stop signal activated later than the receive clock signal; and
a TDC measuring a fine delay time between the receive clock signal and the TDC stop signal.

14. The distance measuring device of claim 13, further comprising a synchronizer controlling the counter and the TDC in response to rising edges of the transmit clock signal and the receive clock signal.

15. The distance measuring device of claim 14, wherein the synchronizer comprises at least one latch and at least one flip-flop.

16. A receiving device of a distance measuring device comprising:
a demodulation unit receiving an impulse signal and demodulating the received impulse signal into a receive clock signal; and
a distance measuring unit measuring a delay time between a transmit clock signal synchronized at a transmitting timing of the impulse signal and the receive clock signal through a TDC technique.

17. The receiving device of claim 16, wherein the distance measuring unit comprises:
a counter measuring a course delay time between the transmit clock signal and a TDC stop signal activated later than the receive clock signal; and
a fine delay time between the receive clock signal and the TDC stop signal.

18. The receiving device of claim 17, wherein the counter starts to measure the course delay time in response to a rising edge of the transmit clock signal and starts to measure the fine delay time in response to a rising edge of the receive clock signal.

19. The receiving device of claim 17, wherein the delay time is a result after the fine delay time is subtracted from the course delay time.

20. A training mannequin for cardiopulmonary resuscitation comprising:
a transmitting device transmitting an impulse signal; and
a receiving device receiving the impulse signal and measuring a delay time between a transmitting timing and a receiving timing of the impulse signal,
wherein the receiving device measures the delay time through a TDC technique and measuring a compression depth through the measured delay time.

21. The training mannequin of claim 20, wherein the receiving device is disposed under a top plate representing the chest of a body and the transmitting device is disposed on a bottom plate representing a body shape.

22. The training mannequin of claim 20, further comprising a reflective plate reflecting an impulse signal transmitted from the transmitting device, wherein the transmitting device and the receiving device are disposed under a top plate representing the chest of a body and the reflective plate is disposed on a bottom plate representing a body shape.

* * * * *